United States Patent
Kim et al.

(10) Patent No.: US 9,905,588 B2
(45) Date of Patent: Feb. 27, 2018

(54) ORGANIC LIGHT EMITTING DISPLAY PANEL AND METHOD OF MANUFACTURING THE SAME

(71) Applicant: LG Display Co., Ltd., Seoul (KR)

(72) Inventors: Ki Woo Kim, Seoul (KR); Jung Hyun Kim, Goyang-si (KR); Jong Seuk Kang, Paju-si (KR); Hyung Jin Bang, Goyang-si (KR); Yoon Ji Choi, Incheon (KR); Min Ho Shin, Bucheon-si (KR); Choong Koo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/800,421

(22) Filed: Jul. 15, 2015

(65) Prior Publication Data
US 2016/0027855 A1    Jan. 28, 2016

(30) Foreign Application Priority Data
Jul. 22, 2014    (KR) .................. 10-2014-0092682

(51) Int. Cl.
*H01L 27/12* (2006.01)
*H01L 29/786* (2006.01)

(52) U.S. Cl.
CPC ........ *H01L 27/1259* (2013.01); *H01L 27/127* (2013.01); *H01L 27/1222* (2013.01); *H01L 29/78696* (2013.01)

(58) Field of Classification Search
CPC ............. H01L 27/3262; H01L 27/1259; H01L 29/1041; H01L 29/36; H01L 29/78696; H01L 2227/323
See application file for complete search history.

(56) References Cited

U.S. PATENT DOCUMENTS

| 4,070,211 A | 1/1978 | Harari |
| 2005/0285111 A1* | 12/2005 | Tsuboi .............. H01L 29/66757 257/66 |
| 2008/0042131 A1 | 2/2008 | Morimoto et al. |
| 2010/0200862 A1* | 8/2010 | Yang .................. H01L 27/1288 257/72 |
| 2013/0063329 A1* | 3/2013 | Saitoh ..................... H01L 27/11 345/55 |

FOREIGN PATENT DOCUMENTS

| CN | 1716617 A | 1/2006 |
| CN | 101127359 A | 2/2008 |

* cited by examiner

*Primary Examiner* — Lauren R Bell
(74) *Attorney, Agent, or Firm* — Birch, Stewart, Kolasch & Birch, LLP (57) ABSTRACT

A display panel and a method for manufacturing the display panel are discussed. The display panel includes a substrate; an active layer on the substrate; and a passivation layer on the active layer, wherein the active layer includes a channel part, a first electrode connection part and a second electrode connection part on opposite sides of the channel part in a first direction, and a first taper part and a second taper part on opposite sides of the channel part in a second direction crossing the first direction, and wherein a carrier concentration of each of the first taper part and the second taper part is different from those of the channel part, the first electrode connection part and the second electrode connection part.

15 Claims, 8 Drawing Sheets

ORGANIC LIGHT EMITTING DISPLAY PANEL AND METHOD OF MANUFACTURING THE SAME

CROSS-REFERENCE TO RELATED APPLICATIONS

This application claims the priority benefit of the Korean Patent Application No. 10-2014-0092682 filed on Jul. 22, 2014, which is hereby incorporated by reference as if fully set forth herein.

BACKGROUND OF THE INVENTION

Field of the Invention

The embodiments of the present invention relate to an organic light emitting display panel and a method of manufacturing the same, and particularly, to an organic light emitting display panel including a low temperature poly silicon (LTPS) thin film transistor (TFT) and a method of manufacturing the same.

Discussion of the Related Art

As times have progressed toward the information-oriented society, flat panel display (FPD) devices which have desired characteristics such as thinness, lightness, and low consumption power are increasing in importance. Examples of the FPD devices include liquid crystal display (LCD) devices, plasma display panels (PDPs), organic light emitting display devices, etc. Recently, electrophoretic display (EPD) devices are being widely used as one type of the FPD device.

In the FDP devices, organic light emitting display devices including a thin film transistor (TFT) use a self-emitting device and have low power consumption, a fast response time, high emission efficiency, high luminance, and a wide viewing angle. Therefore, the organic light emitting display devices are attracting much attention as next-generation FPD devices.

Particularly, an LTPS TFT may be manufactured at a low temperature. In comparison with an amorphous silicon (a-Si) TFT, the LTPS TFT has a high mobility of an electron or a hole, and because it is possible to implement a complementary metal-oxide semiconductor (CMOS) transistor including an N channel and a P channel, the LTPS TFT may be applied to a large-size substrate.

Figure 1:
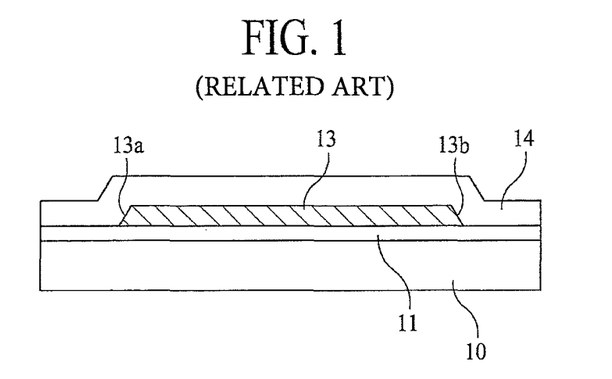
FIG. 1 is a cross-sectional view for describing an active layer of a related art LTPS TFT.

FIG. 1 is a cross-sectional view for describing an active layer of a related art LTPS TFT.

As illustrated in FIG. 1, an organic light emitting display panel including the related art LTPS TFT includes a buffer 11 formed on a substrate 10, an active layer 13 formed on the buffer 11, a gate insulation layer 14 formed on the active layer 13, a gate electrode (not shown) formed on the gate insulation layer 14, an interlayer dielectric (not shown) formed on the gate electrode (not shown), first and second electrodes (not shown) formed on the interlayer dielectric (not shown), and an organic light emitting diode (OLED, not shown) connected to the first electrode or the second electrode.

The active layer 13 of the LTPS TFT is formed on the substrate 10 through a photolithography process using a mask. In this instance, inclined planes 13a and 13b are respectively formed on both sides of the active layer 13 formed on the substrate 10.

When the related art LTPS TFT is driven, a strong electric field is generated from each of the inclined planes 13a and 13b of the active layer 13. As the strong electric field is generated, a free carrier occurs in each of the inclined planes 13a and 13b, and a hump channel where a high current flows even under a low voltage may be formed.

A gate-source voltage (Vgs) which is a difference voltage between a gate and a source is shifted in a negative (−) direction by the hump channel. As the gate-source voltage (Vgs) is shifted in the negative (−) direction, an off-current of a TFT increases.

Moreover, consumption of power of the organic light emitting display panel increases, and for this reason, deterioration of a transistor is accelerated.

Moreover, a reliability of the organic light emitting display panel is degraded.

SUMMARY OF THE INVENTION

Accordingly, the present invention is directed to provide an organic light emitting display panel and a method of manufacturing the same that substantially obviate one or more problems due to limitations and disadvantages of the related art.

An aspect of the present invention is directed to provide an organic light emitting display panel for reducing an off-current of a TFT and reducing power consumption of a display panel.

According to an aspect of the present invention, a display panel includes a substrate; an active layer on the substrate; and a passivation layer on the active layer, wherein the active layer includes a channel part, a first electrode connection part and a second electrode connection part on opposite sides of the channel part in a first direction, and a first taper part and a second taper part on opposite sides of the channel part in a second direction crossing the first direction, and wherein a carrier concentration of each of the first taper part and the second taper part is different from those of the channel part, the first electrode connection part and the second electrode connection part.

According to another aspect of the present invention, a method of making a display panel includes forming an active layer on a substrate; and doping the active layer to form a channel part, a first electrode connection part and a second electrode connection part on opposite sides of the channel part in a first direction, and a first taper part and a second taper part on opposite sides of the channel part in a second direction crossing the first direction so that a carrier concentration of each of the first taper part and the second taper part is different from those of the channel part, the first electrode connection part and the second electrode connection part.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Reference will now be made in detail to the example embodiments of the present invention, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including an instance where one element is formed at a top of another element and moreover an instance where a third element is disposed therebetween.

Hereinafter, an organic light emitting display panel and a method of manufacturing the same according to embodiments of the present invention will be described in detail with reference to the accompanying drawings.

Figure 2:
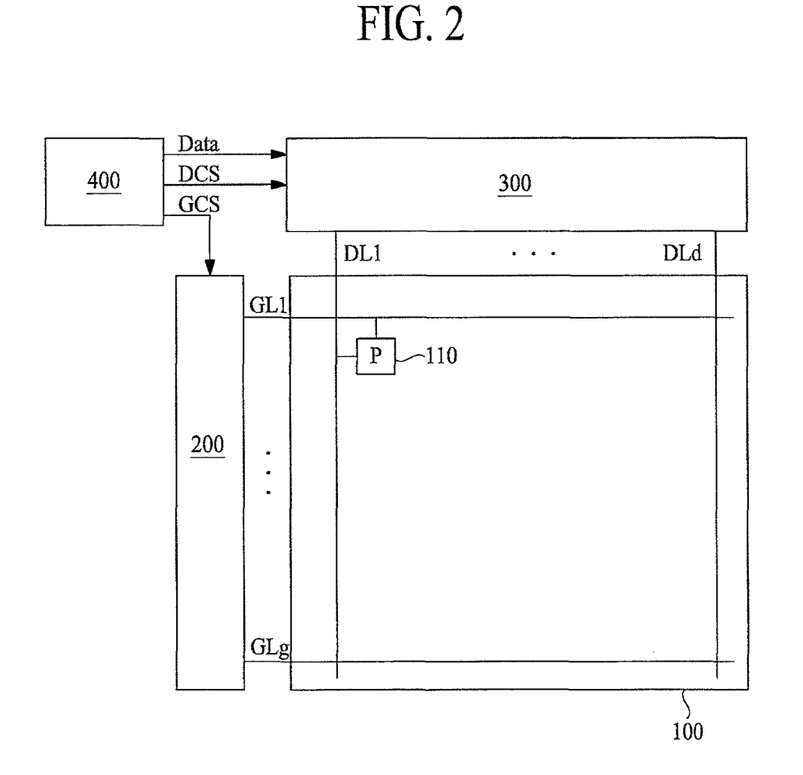
FIG. 2 is an example diagram schematically illustrating a configuration of a display device to which an organic light emitting display panel according to an embodiment of the present invention is applied.

FIG. 2 is an example diagram schematically illustrating a configuration of a display device to which an organic light emitting display panel according to an embodiment of the present invention is applied.

The display device to which the organic light emitting display panel according to an embodiment of the present invention is applied, as illustrated in FIG. 2, includes: a panel 100 where a pixel (P) 110 is provided in each of intersection areas of a plurality of gate lines GL1 to GLg and a plurality of data lines DL1 to DLd; a gate driver 200 that supplies a scan pulse to the gate lines GL1 to GLg provided in the panel 100; a data driver 300 that respectively supplies data voltages to the data lines DL1 to DLd provided in the panel 100; and a timing controller 400 that controls operations of the gate driver 200 and the data driver 300.

In the panel 100, the pixel (P) 110 may be provided in each of a plurality of areas defined by intersections of the gate lines GL and the data lines DL. The pixel 110 may include an organic light emitting diode (OLED), which emits light, and a driver that drives the OLED.

First, the OLED may be implemented in a top emission type where the light emitted from the OLED is transferred to the outside through an upper substrate, or may be implemented in a bottom emission type where the light emitted from the OLED is transferred to a lower substrate.

Second, the driver may include two or more transistors, which are coupled to a data line DL and a gate line GL and control driving of the OLED, and a storage capacitor.

An anode of the OLED may be coupled to a first power source, and a cathode of the OLED may be coupled to a second power source. The OLED may emit light having certain luminance according to a current supplied from a driving transistor.

When the scan pulse is supplied to the gate line GL, the driver may control an amount of current supplied to the OLED according to a data voltage supplied to the data line DL.

To this end, the driving transistor may be coupled between the first power source and the OLED, and a switching transistor may be coupled to the driving transistor, the data line DL, and the gate line GL.

Hereinafter, the panel 100 will be described in detail with reference to FIGS. 3 to 6G.

The timing controller 400 may output a gate control signal GCS for controlling the gate driver 200 and a data control signal DCS for controlling the data driver 300 by using a vertical sync signal, a horizontal sync signal, and a clock which are supplied from an external system.

The data driver 300 may convert image data, which are input from the timing controller 400, into analog data voltages and may respectively supply the data voltages for one horizontal line to the data lines DL1 to DLd every one horizontal period where the scan pulse is supplied to one gate line. That is, the data driver 300 may convert the image data into the data voltages by using gamma voltages supplied from a gamma voltage generator and may respectively output the data voltages to the data lines DL1 to DLd.

The gate driver 200 may supply the scan pulse to the gate lines GL1 to GLg of the panel 100 in response to the gate control signal GCS input from the timing controller 400. Therefore, a plurality of switching transistors which are respectively provided in a plurality of pixels 110 corresponding to a horizontal line to which the scan pulse is applied may be turned on, and thus, an image may be output to each of the plurality of pixels 110.

Figure 3:
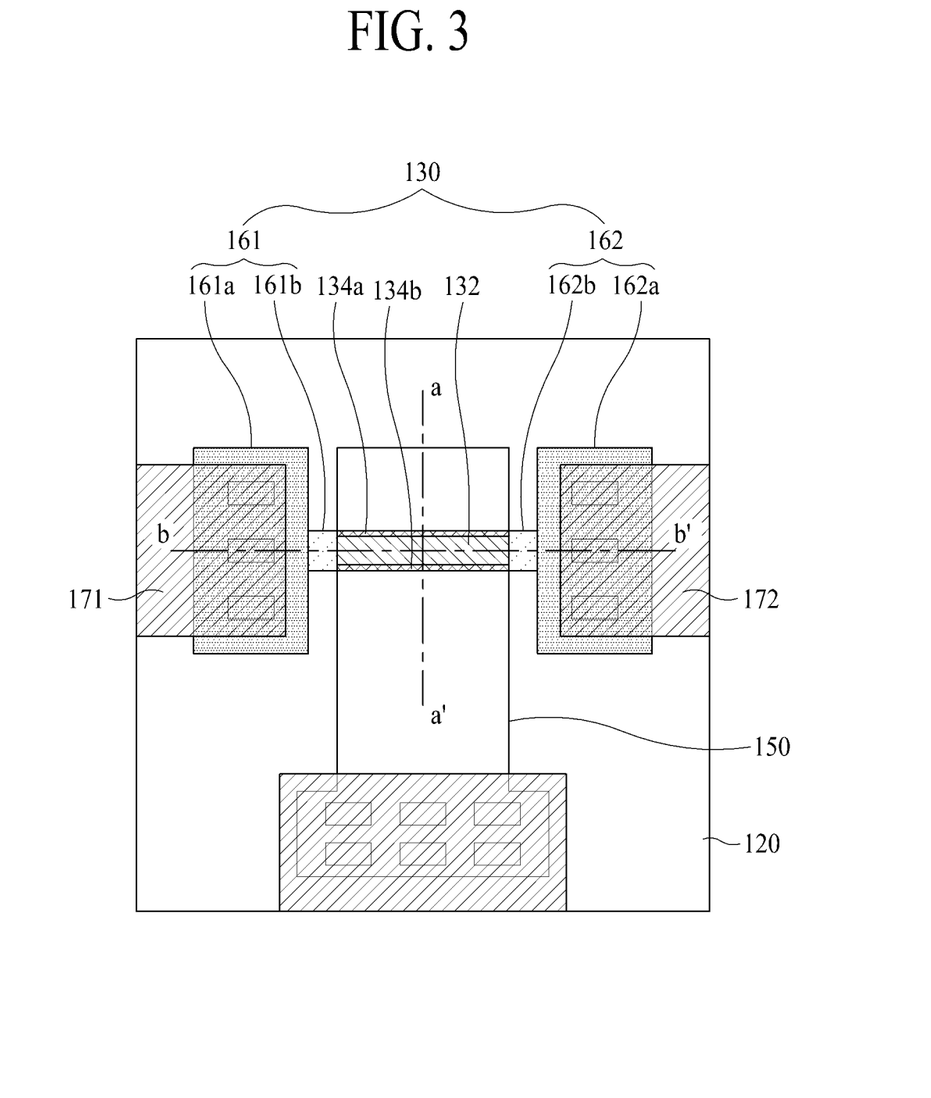
FIG. 3 is a plan view schematically illustrating a structure of an LTPS TFT applied to an organic light emitting display panel according to an embodiment of the present invention.
Figure 4A:
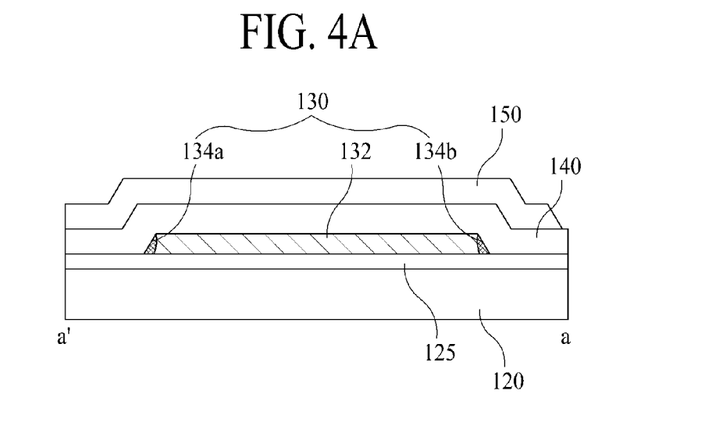
FIG. 4A is a cross-sectional view illustrating a cross-sectional surface taken along line a-a' of FIG. 3 illustrating the LTPS TFT applied to the organic light emitting display panel according to an embodiment of the present invention.
Figure 4B:
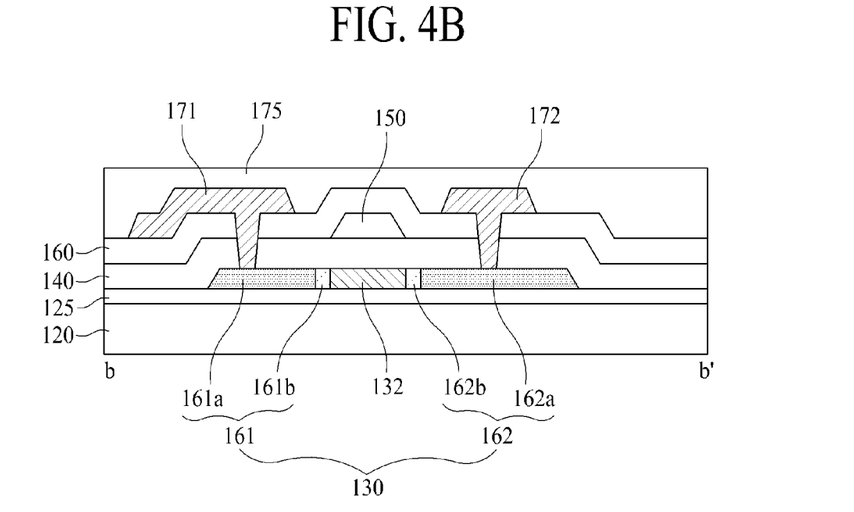
FIG. 4B is a cross-sectional view illustrating a cross-sectional surface taken along line b-b' of FIG. 3 illustrating the LTPS TFT applied to the organic light emitting display panel according to an embodiment of the present invention.

FIG. 3 is a plan view schematically illustrating a structure of an LTPS TFT applied to an organic light emitting display panel according to an embodiment of the present invention. FIG. 4A is a cross-sectional view illustrating a cross-sectional surface taken along line a-a' of FIG. 3 illustrating the LTPS TFT applied to the organic light emitting display panel according to an embodiment of the present invention. FIG. 4B is a cross-sectional view illustrating a cross-sectional surface taken along line b-b' of FIG. 3 illustrating the LTPS TFT applied to the organic light emitting display panel according to an embodiment of the present invention.

The organic light emitting display panel according to an embodiment of the present invention, as illustrated in FIGS. 3, 4A and 4B, may include: an active layer 130 that is formed on a substrate 120; a gate insulation layer 140 that is formed on the active layer 130; a gate electrode 150 that is formed on the gate insulation layer 140; an interlayer dielectric 160 that is formed on the gate electrode 150; a first electrode 171 that is formed on the interlayer dielectric 160 and is electrically coupled to the first electrode connection part 161; a second electrode 172 that is formed on the interlayer dielectric 160 and is electrically coupled to the second electrode connection part 162; a passivation layer 175 that is formed on the first electrode 171 and the second electrode 172; and an OLED that is formed on the passivation layer 175 and is connected to the first electrode 171 or the second electrode 172.

As illustrated in FIG. 3, the active layer 130 includes the channel part 132, the first and second electrode connection parts 161 and 162 which are respectively formed on the first side and the second side of the channel part 132 facing each other, and the first and second taper parts 134a and 134b that are respectively formed on the third side and the fourth side of the channel part 132 facing each other.

Here, the first electrode connection part 161 and the second electrode connection part 162 may be respectively formed on the first side and the second side of the channel part 132 to face each other in correspondence with a first direction b-b' of the substrate 120. Also, the first taper part 134a and the second taper part 134b may respectively be an edge of the third side and an edge of the fourth side of the channel part 132 which are parallel to each other to correspond to a second direction a-a' intersecting the first direction b-b'. A carrier concentration of each of the first and second taper parts 134a and 134b may be higher than that of the channel part 132 and lower than that of each of the first and second electrode connection parts 161 and 162.

Hereinafter, the channel part 132, the first electrode connection part 161, the second electrode connection part 162, the first taper part 134a, and the second taper part 134b will be described in detail through a doping process where impurities are injected into the active layer 130 (for example, a-Si) and which will be described with reference to FIGS. 5A to 5G and 6A to 6G.

As one type of the LTPS TFT, an NMOS TFT may include a lightly doped drain (LDD) area where a portion of each of the first and second electrode connection parts 161 and 162 is doped at a low concentration, for reducing an off-current. For example, the portion of the first electrode connection part 161 may denote a portion of the first electrode connection part 161 which is adjacent to the channel part 132, and the portion of the second electrode connection part 162 may denote a portion of the second electrode connection part 162 which is adjacent to the channel part 132.

Therefore, the first electrode connection part 161 may include a first high concentration doping area 161a and a first low concentration doping area 161b of which a carrier concentration is lower than that of the first high concentration doping area 161a. Also, the second electrode connection part 162 may include a second high concentration doping area 162a and a second low concentration doping area 162b of which a carrier concentration is lower than that of the second high concentration doping area 162a.

The first low concentration doping area 161b may be disposed between the first high concentration doping area 161a and the channel part 132, and the second low concentration doping area 162b may be disposed between the second high concentration doping area 162a and the channel part 132.

In a method of forming the active layer 130, a first doping process and a second doping process (i.e., a two-time doping process) may be performed on the first taper part 134a and the second taper part 134b. The second doping process (i.e., a one-time doping process) may be performed on the channel part 132. Therefore, the active layer 130 may be formed in order for a carrier concentration of each of the first and second taper parts 134a and 134b to be higher than that of the channel part 132.

As described above, since the active layer 130 is provided, an electric field cannot focus on the first taper part 134a and the second taper part 134b, thereby preventing a free carrier from occurring in the first taper part 134a and the second taper part 134b.

Moreover, the gate-source voltage (Vgs) is prevented from being shifted in the negative (−) direction by the hump channel.

Moreover, an off-current of a TFT is reduced, and an organic light emitting display panel of which consumption power is low is implemented.

Moreover, a TFT is prevented from being deteriorated, and a reliability of an organic light emitting display panel is enhanced.

In a process of forming the active layer 130 according to an embodiment of the present invention, a mask is not added. Accordingly, an organic light emitting display panel having the above-described efficiency is implemented without an increase in the process cost.

The gate insulation layer 140 may be formed on the active layer 130. An inorganic insulating material such as oxide silicon ($SiO_2$) may be used as the gate insulation layer 140.

The gate electrode 150 may be formed on the gate insulation layer 140. The gate electrode 150 may be formed by depositing and a conductive material, which is used as the gate electrode 150, all over the substrate 120 and patterning the conductive material.

The interlayer dielectric 160 may be formed on the gate electrode 150. The first electrode 171 electrically coupled to the first electrode connection part 161 and the second electrode 172 electrically coupled to the second electrode connection part 162 may be formed on the interlayer dielectric 160.

The passivation layer 175 may be formed on the first electrode 171 and the second electrode 172, and the OLED which includes a third electrode 180 (see FIG. 5G) connected to the first electrode 171 or the second electrode 172 may be formed on the passivation layer 175. The OLED may include the third electrode 180, an organic emission layer stacked on the third electrode 180, and a fourth electrode stacked on the organic emission layer. Also, a sealing part may be formed all over the fourth electrode.

FIGS. 5A to 5G are example diagrams for describing a method of manufacturing an organic light emitting display panel according to an embodiment of the present invention.

Figure 5A:
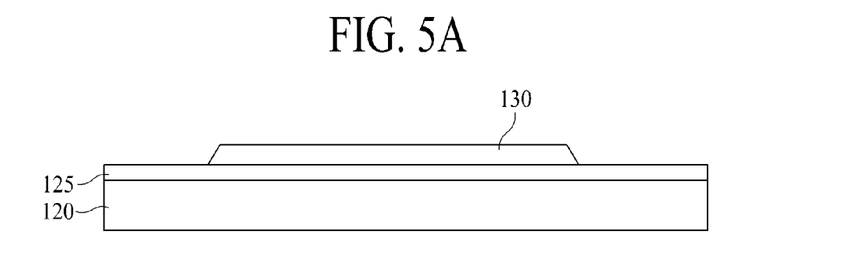
FIGS. 5A to 5G are example diagrams for describing a method of manufacturing an organic light emitting display panel according to an embodiment of the present invention.

First, as illustrated in FIG. 5A, the active layer 130 may be formed on the substrate 120. The active layer 130 includes the first taper part 134a and the second taper part 134b which are respectively disposed on the third side and the fourth side facing each other.

The active layer 130 may be formed to have a certain thickness from a top of the substrate 120. The first and second taper parts 134a and 134b may be formed on the respective sides of the active layer 130 to be inclined at a certain slope, and a cross-sectional area of each of the first and second taper parts 134a and 134b may be enlarged in a direction from a top of the active layer 130 to a surface of the substrate 120.

The first doping process, where impurities are injected into the first and second taper parts 134a and 134b of the active layer 130, may be performed. In this instance, the impurities may be selectively injected into only portions of the first and second taper parts 134a and 134b which do not overlap a photoresist 190 formed on the active layer 130.

Hereinafter, a detailed method of forming the active layer 130 and a first doping process will be described in detail with reference to FIGS. 6A to 6G.

Figure 5B:
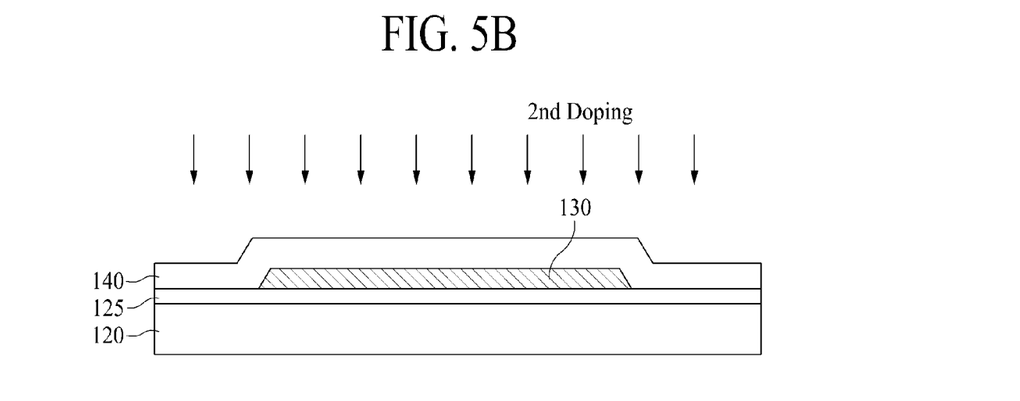

Subsequently, as illustrated in FIG. 5B, the gate insulation layer 140 may be formed on the active layer 130. A second doping process of injecting impurities may be performed on a portion of the active layer 130 which is covered by the gate insulation layer 140. In this instance, Group 3 elements (for example, B, Al, Ga, and In) may be injected into the active layer 130 as the impurities. However, the present embodiment is not limited thereto, and Group 5 elements (for example, P, As, and Sb) may be injected into the active layer 130 as the impurities.

Figure 5C:
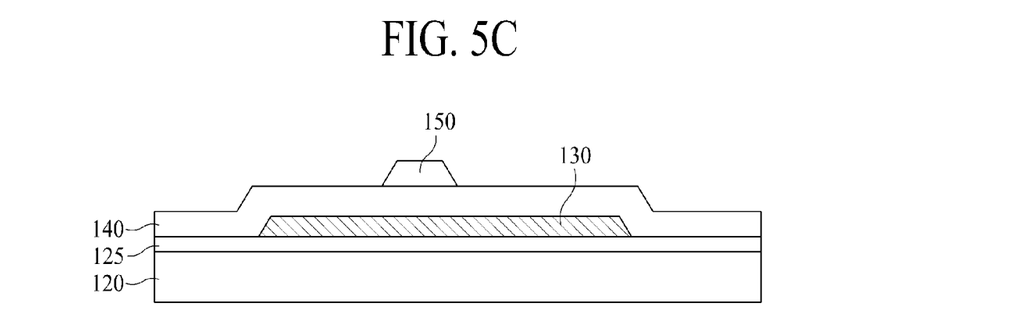

Subsequently, as illustrated in FIG. 5C, the gate electrode 150 may be formed on the gate insulation layer 140. The gate electrode 150 may be formed of a low-resistance metal material, for example, aluminum (Al), aluminum alloy (AlNd), copper (Cu), or copper alloy. The gate electrode 150 may be disposed at a center of the active layer 130 with the gate insulation layer 140 therebetween.

Figure 5D:
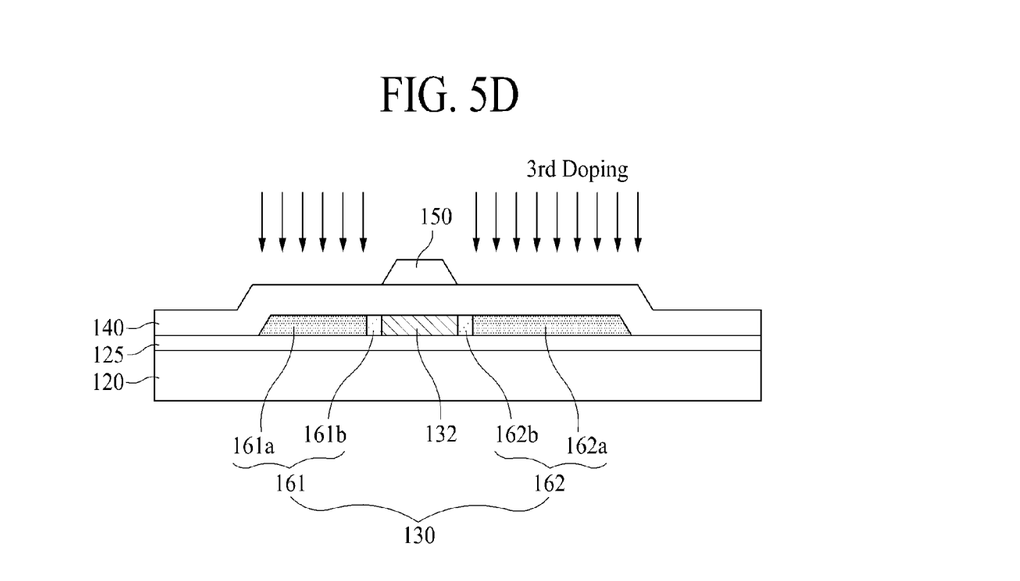

Subsequently, as illustrated in FIGS. 3 and 5D, in a third doping process, impurities may be injected into the first side and the second side of the active layer 130 which face each other and do not overlap the gate electrode 150. By performing the third doping process, the active layer 130 may be divided into the channel part 132 and the first and second electrode connection parts 161 and 162 which are respectively disposed on the first side and the second side of the channel part 132 facing each other.

In the third doping process, impurities may not be injected into the channel part 132, the first taper part 134a, and the second taper part 134b which overlap the gate electrode 150, and may be injected into only the first electrode connection part 161 and the second electrode connection part 162 which do not overlap the gate electrode 150.

In this instance, Group 5 elements (for example, P, As, and Sb) may be used as the impurities. However, the present embodiment is not limited thereto, and Group 3 elements (for example, B, Al, Ga, and In) may be used as the impurities. When Group 3 elements are injected as impurities in the first doping process and the second doping process, Group 5 elements may be injected as impurities in the third doping process. When Group 5 elements are injected as impurities in the first doping process and the second doping process, Group 3 elements may be injected as impurities in the third doping process.

As one type of the LTPS TFT, the NMOS TFT may include the LDD area where a portion of each of the first and second electrode connection parts 161 and 162 is doped at a low concentration, for reducing an off-current. For example, the portion of the first electrode connection part 161 may denote a portion of the first electrode connection part 161 which is adjacent to the channel part 132, and the portion of the second electrode connection part 162 may denote a portion of the second electrode connection part 162 which is adjacent to the channel part 132.

That is, the third doping process may be performed, and then, a fourth doping process using a doping mask may be further performed on a portion of each of the first and second electrode connection parts 161 and 162, for forming the LDD area. For example, the doping mask may be greater than a width of the gate electrode 150 and may cover a portion of each of the first and second electrode connection parts 161 and 162.

In the fourth doping process, the doping mask may be disposed on the gate electrode 150, and then, impurities may be injected into the active layer 130. Therefore, the impurities may not be injected into an area covered by the doping mask, and may be injected into only an area which is not covered by the doping mask.

By performing the fourth doping process, the first electrode connection part 161 may be divided into the first high concentration doping area 161a and the first low concentration doping area 161b of which a carrier concentration is lower than that of the first high concentration doping area 161a. Also, the second electrode connection part 162 may be divided into the second high concentration doping area 162a and the second low concentration doping area 162b of which a carrier concentration is lower than that of the second high concentration doping area 162a.

The first low concentration doping area 161b may be disposed between the first high concentration doping area 161a and the channel part 132, and the second low concentration doping area 162b may be disposed between the second high concentration doping area 162a and the channel part 132.

To provide a summary on the above description, in the first doping process and the second doping process, a process of injecting impurities into the first and second taper parts 134a and 134b which are respectively disposed on the third side and the fourth side of the active layer 130 facing each other may be performed twice. In the second doping process, a process of injecting impurities into the channel part 132 which is disposed between the first taper part 134a and the second taper part 134b may be performed once. Therefore, a carrier concentration of each of the first and second taper parts 134a and 134b may be higher than that of the channel part 132.

Moreover, in the second doping process and the third doping process, impurities may be injected into the first low concentration doping area 161b of the first electrode connection part 161 and the second low concentration doping area 162b of the second electrode connection part 162. In the second, third, and fourth doping processes, impurities may be injected into the first high concentration doping area 161a and the second high concentration doping area 162a. Thus, the first low concentration doping area 161b and the second low concentration doping area 162b which are the LDD areas may be formed.

Figure 5E:
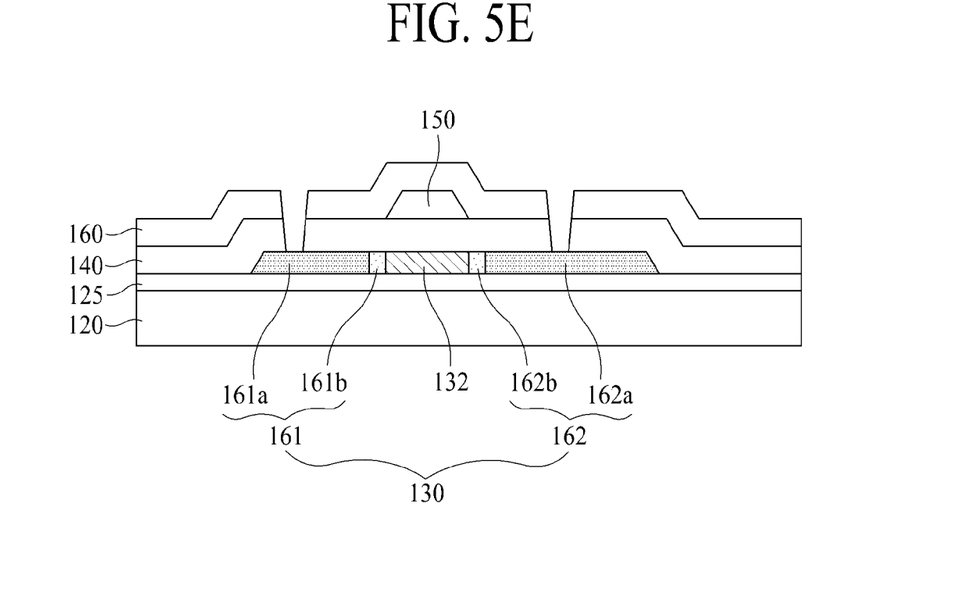
Figure 5F:
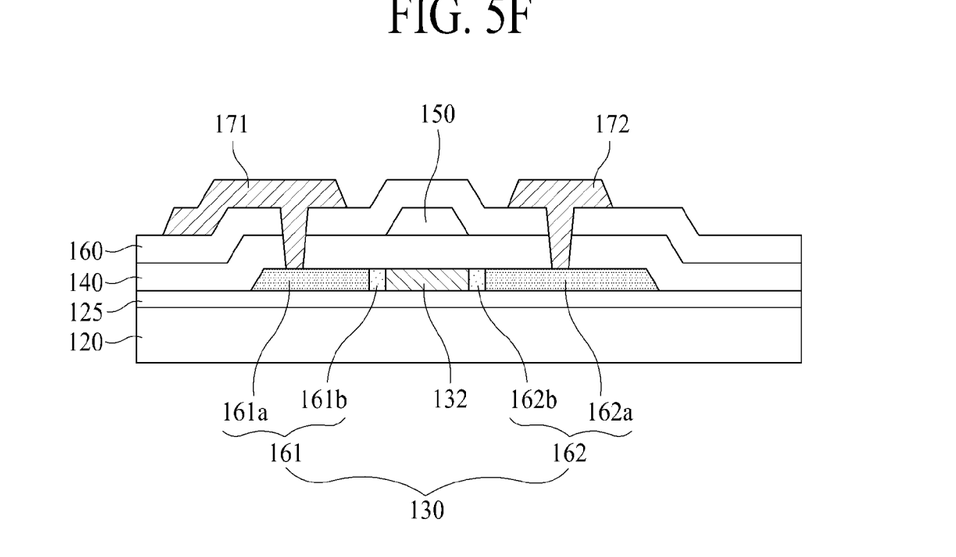

Subsequently, as illustrated in FIG. 5E, the interlayer dielectric 160 may be formed on the substrate 120 including the active layer 130. The first electrode 171 connected to the first electrode connection part 161 and the second electrode 172 connected to the second electrode connection part 162 may be formed on the interlayer dielectric 160. The first electrode 171 and the second electrode 172 may be electrically coupled to the first electrode connection part 161 and the second electrode connection part 162 through a contact hole which is included in the interlayer dielectric 160, respectively.

Figure 5G:
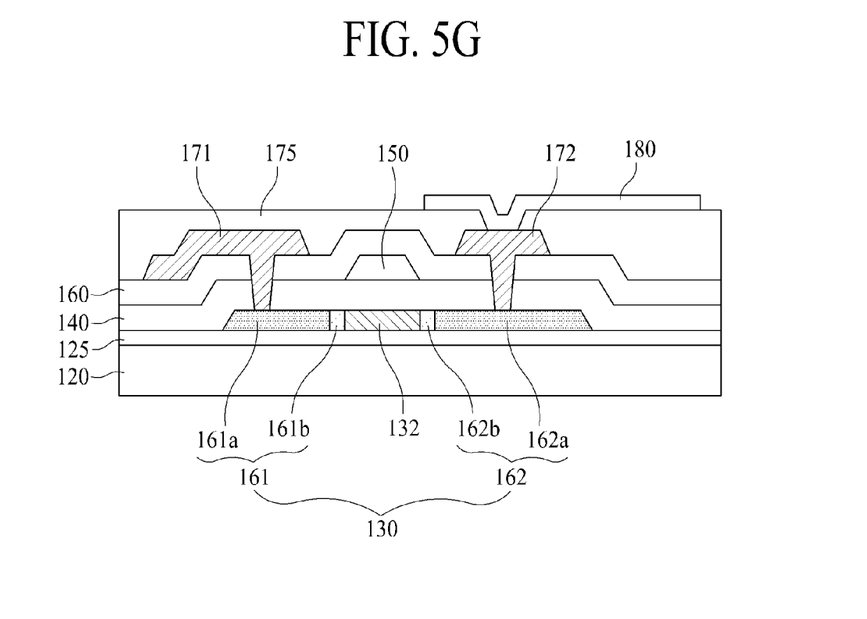

Finally, as illustrated in FIG. 5G, the passivation layer 175 may be formed on the first electrode 171 and the second electrode 172. The passivation layer 175 may be formed of, for example, an organic material such as polyimide (PI), polyamide (PA), acryl resin, benzocyclobutene (BCB), or phenol resin.

The OLED, which includes the third electrode 180 connected to the second electrode 172, may be formed on the passivation layer 175. The OLED may include the third electrode 180, the organic emission layer formed on the third electrode 180, and the fourth electrode formed on the organic emission layer. Also, the sealing part may be formed all over the fourth electrode.

The organic emission layer may be formed to have a structure of a hole transport layer/emission layer/electron transport layer or a structure of a hole injection layer/hole transport layer/electron transport layer/electron injection layer. Furthermore, the organic emission layer may further include a function layer for enhancing an emission efficiency and/or a service life of the organic emission layer.

The fourth electrode formed on the organic emission layer may act as a cathode electrode when the third electrode 180 acts as an anode electrode.

The sealing part protects the OLED and the TFT from an external impact and prevents moisture from penetrating into a device.

FIGS. 6A to 6G are example diagrams for describing a method of manufacturing an active layer of the LTPS TFT applied to the organic light emitting display panel according to an embodiment of the present invention.

Figure 6A:
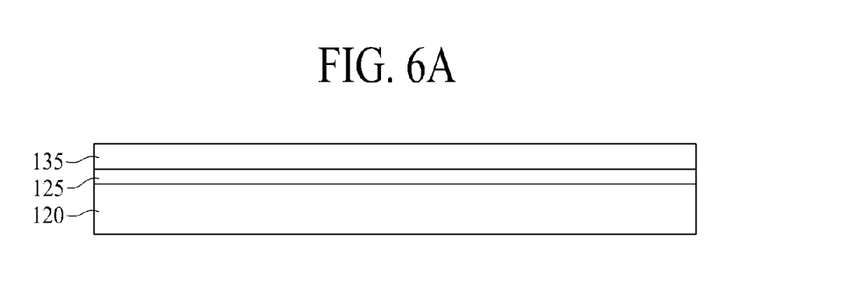
FIGS. 6A to 6G are example diagrams for describing a method of manufacturing an active layer of the LTPS TFT applied to the organic light emitting display panel according to an embodiment of the present invention.

First, as illustrated in FIG. 6A, an active material 135 may be provided all over the substrate 120. A glass substrate or a plastic substrate may be used as the substrate 120. In the LTPS TFT, a-Si may be used as the active material 135. In this instance, a buffer 125 may be formed between the substrate 120 and the active material 135. The buffer 125 prevents impurities such as metal ions from being spread from the substrate 120 and penetrating into the active layer 130.

Figure 6B:
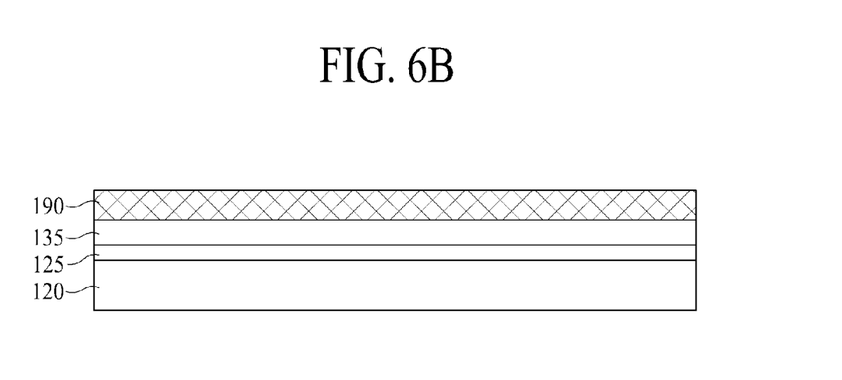

Subsequently, as illustrated in FIG. 6B, a photoresist (PR) 190 may be coated on the active material 135. The photoresist 190 which is a photosensitive polymer resin may be mainly used in a photolithography process of forming a fine pattern on a substrate. Since properties of the photoresist 190 are chemically changed by light, the photoresist 190 may be selectively dissolved based on a solubility difference between an exposure part and a non-exposure part.

The photoresist 190 may be classified into a positive type (a positive PR) and a negative type (a negative PR). Here, the positive PR may be a photosensitive material where a portion unexposed to light is hardened to form a pattern and a portion exposed to the light is rinsed out by a solvent. The positive PR may be used for forming the active layer 130, but not limited thereto.

Figure 6C:
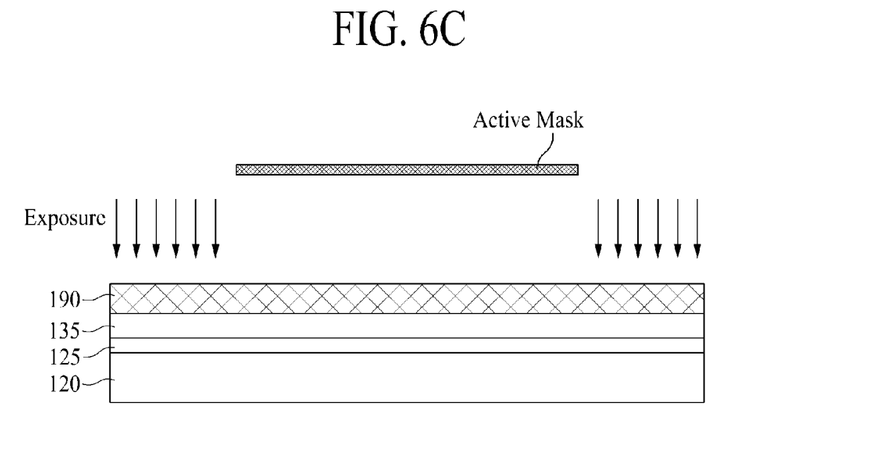
Figure 6D:
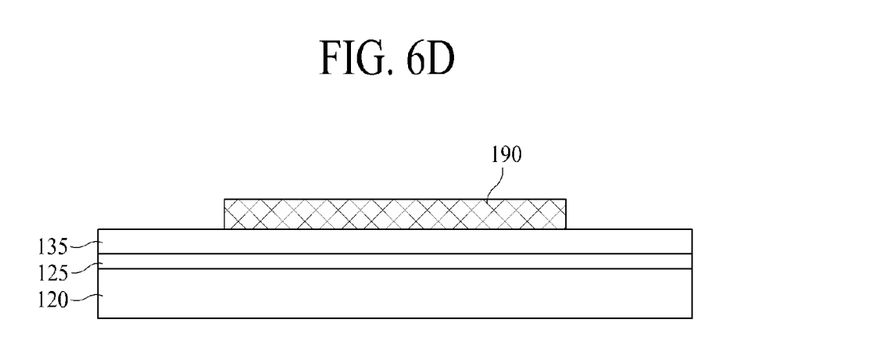

Subsequently, as illustrated in FIG. 6C, an active mask where an active area is patterned may be disposed on the photoresist 190. The exposure part and the non-exposure part may be determined based on a pattern of the active mask. The exposure part may be an area exposed to light, and the non-exposure part may be an area unexposed by the light. Therefore, as illustrated in FIG. 6D, the photoresist 190 of the non-exposure part may be developed to form a pattern.

Figure 6E:
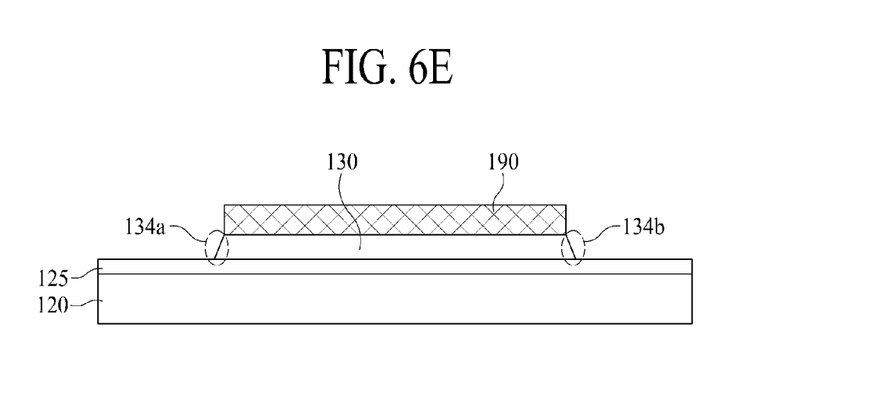

Subsequently, as illustrated in FIG. 6E, the active material 135 which is exposed through a development process may be patterned through an etching process. The active layer 130, including the first taper part 134a and the second taper part 134b which are respectively disposed on the third side and the fourth side facing each other, may be formed by etching the active material 135.

The active layer 130 may be formed to have a certain thickness from the top of the substrate 120. The first and second taper parts 134a and 134b may be formed on the respective sides of the active layer 130 to be inclined at a certain slope, and a cross-sectional area of each of the first and second taper parts 134a and 134b may be enlarged in a direction from the top of the active layer 130 to a surface of the substrate 120.

Figure 6F:
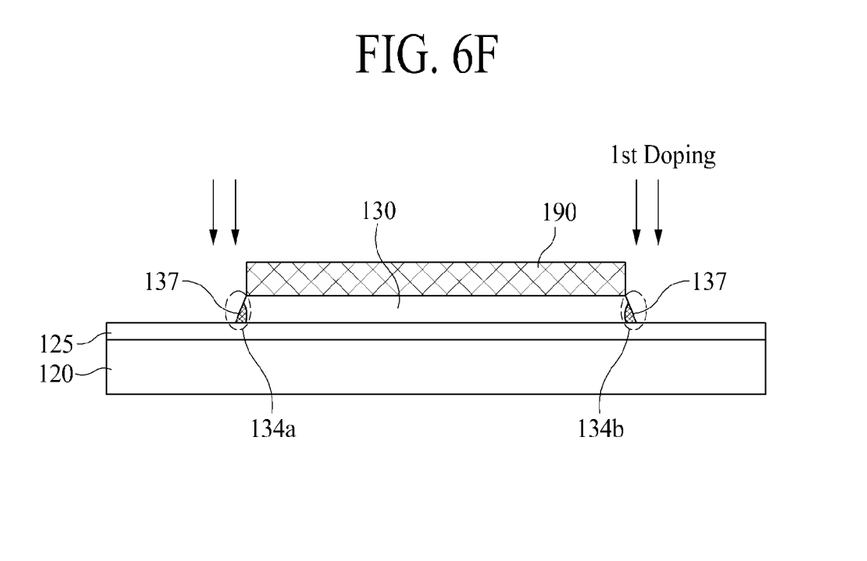

Subsequently, as illustrated in FIG. 6F, a first doping operation of injecting first doping material 137 into the first and second taper parts 134a and 134b may be performed. In this instance, the first doping material 137 may be selectively injected into only portions of the first and second taper parts 134a and 134b which do not overlap a photoresist 190 formed on the active layer 130. In this instance, Group 3 elements (for example, B, Al, Ga, and In) may be injected into the first and second taper parts 134a and 134b as the first doping material 137. However, the present embodiment is not limited thereto, and Group 5 elements (for example, P, As, and Sb) may be injected into the active layer 130 as the first doping material 137.

Figure 6G:
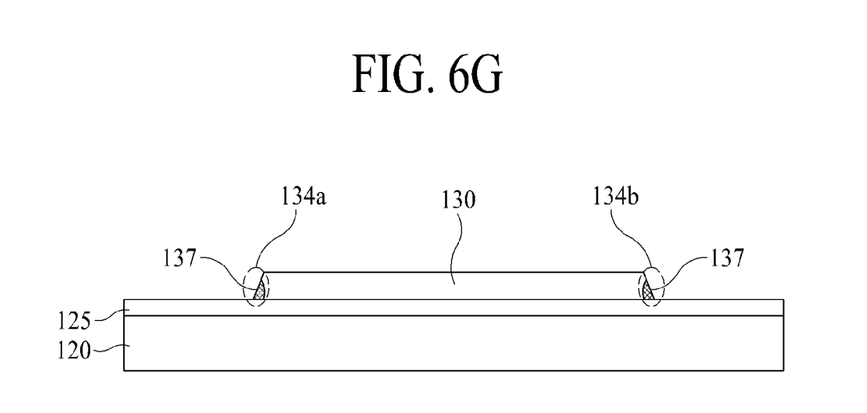

Subsequently, as illustrated in FIG. 6G, the active layer 130 where the first and second taper parts 134a and 134b are selectively doped may be formed by removing the photoresist 190 from the active layer 130.

The organic light emitting display panel according to an embodiment of the present invention has been described above with the NMOS TFT, which is one type of the LTPS TFT, as an example, but is not limited thereto. For example, a PMOS TFT may be applied to the present invention.

Moreover, the LTPS TFT has been described above as an example of the present invention, but the present invention is not limited thereto. All TFTs (for example, an oxide transistor, an a-Si transistor, etc.) which have a hump characteristic based on the hump channel may be applied to the present invention.

Moreover, the organic light emitting display panel has been described above as an example of the present invention, but the present invention is not limited thereto. The present invention may be applied to all display panels which include a TFT having the hump characteristic.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display panel, comprising:
a substrate;
an active layer on the substrate; and a passivation layer on the active layer,
wherein the active layer includes a channel, a source and a drain on opposite sides of the channel in a first direction that extends through centers of the source, the channel, and the drain, and a first taper part and a second taper part on opposite sides of the channel in a second direction that crosses and is perpendicular to the first direction, wherein the first direction is parallel to opposite side surfaces of the channel, wherein a carrier concentration of each of the first taper part and the second taper part is different from a carrier concentration of each of the channel, the source and the drain, wherein the source includes a first high concentration doping area and a first low concentration doping area, wherein the drain includes a second high concentration doping area and a second low concentration doping area, wherein the first low concentration doping area is interposed between the first high concentration doping area and the channel in the first direction, and the second low concentration doping area is interposed between the second high concentration doping area and the channel in the first direction, wherein the carrier concentration of each of the first taper part and the second taper part is higher than the carrier concentration of the channel, wherein a carrier concentration of each of the first and second high concentration doping areas is higher than a carrier concentration of each of the first and second low concentration doping areas, and the carrier concentration of each of the first and second low concentration doping areas is higher than the carrier concentration of each of the first and second taper parts, wherein the channel, the first low concentration doping area, the second low concentration doping area, the first high concentration doping area, and the second high concentration doping area are each symmetric about a center line that is parallel to the first direction, wherein the channel is symmetric about the center line for an entire length of the channel in the first direction, wherein the first taper part is a mirror image of the second taper part about the center line for the entire length of the channel in the first direction, and wherein the channel and the first and second taper parts are doped with a same element from a first element group, and the source and drain are doped with a different element from a second element group different from the first element group.

2. The display panel of claim 1, wherein the carrier concentration of each of the first taper part and the second taper part is lower than a carrier concentration of each of the source and the drain.

3. The display panel of claim 1, wherein the first taper part contacts both the channel and the first low concentration doping area, and
wherein the second taper part contacts both the channel and the second low concentration doping area.

4. The display panel of claim 1, further comprising:
a gate insulation layer on the active layer;
a gate electrode on the gate insulation layer;
an interlayer dielectric layer on the gate electrode;
a first electrode on the interlayer dielectric layer and electrically coupled to the source; and
a second electrode on the interlayer dielectric layer and electrically coupled to the drain.

5. The display panel of claim 1, wherein the first taper part and the second taper part are limited to the opposite side surfaces of the channel and are not formed in the first and second low centration doping areas.

6. A method of making a display panel, the method comprising:
forming an active layer on a substrate; and
doping the active layer to form a channel, a source and a drain on opposite sides of the channel in a first direction that extends through centers of the source, the channel, and the drain, and a first taper part and a second taper part on opposite sides of the channel in a second direction that crosses and is perpendicular to the first direction, wherein the first direction is parallel to opposite side surfaces of the channel, wherein a carrier concentration of each of the first taper part and the second taper part is different from a carrier concentration of each of the channel, the source and the drain, wherein the source includes a first high concentration doping area and a first low concentration doping area, wherein the drain includes a second high concentration doping area and a second low concentration doping area, wherein the first low concentration doping area is interposed between the first high concentration doping area and the channel in the first direction, and the second low concentration doping area is interposed between the second high concentration doping area and the channel in the first direction, wherein the carrier concentration of each of the first taper part and the second taper part is higher than the carrier concentration of the channel, wherein a carrier concentration of each of the first and second high concentration doping areas is higher than a carrier concentration of each of the first and second low concentration doping areas, and the carrier concentration of each of the first and second low concentration doping areas is higher than the carrier concentration of each of the first and second taper parts, wherein the channel, the first low concentration doping area, the second low concentration doping area, the first high concentration doping area, and the second high concentration doping area are each symmetric about a center line that is parallel to the first direction, wherein the channel is symmetric about the center line for an entire length of the channel in the first direction, wherein the first taper part is a mirror image of the second taper part about the center line for the entire length of the channel in the first direction, and wherein the channel and the first and second taper parts are doped with a same element from a first element group, and the source and drain are doped with a different element from a second element group different from the first element group.

7. The method of claim 6, wherein the doping of the active layer comprises:
a first doping process to inject impurities into the first and second taper parts;
a second doping process to inject impurities into the channel and the first and second taper parts;
a third doping process to inject impurities into the source and the drain; and
a fourth doping process to further inject impurities into portions of the source and the drain.

8. The method of claim 7, wherein the second, third and fourth doping processes each inject impurities into portions of the source and the drain to form the first high concentration doping area of the source, and the second high concentration doping area of the drain.

9. The method of claim 6, wherein the first taper part contacts both the channel and the first low concentration doping area, and
wherein the second taper part contacts both the channel and the second low concentration doping area.

10. The method of claim 6, wherein the first taper part and the second taper part are formed by:
   providing an active material on the substrate;
   coating a photoresist on the active material;
   using a mask to expose a portion of the photoresist to be etched; and
   etching the portion of the photoresist and a portion of the active material underneath the portion of the photoresist.

11. The method of claim 10, further comprising doping the first taper part and the second taper part while the photoresist remains on the active material.

12. The method of claim 11, further comprising:
   removing the photoresist after the doping of the first taper part and the second taper part; and
   subsequently doping the active material to form the source and the drain.

13. The method of claim 6, further comprising forming a gate insulation layer on the active layer, a gate electrode on the gate insulation layer, an interlayer dielectric layer on the gate electrode, a first electrode on the interlayer dielectric layer and electrically coupled to the source, a second electrode on the interlayer dielectric layer and electrically coupled to the drain, and a passivation layer on the first electrode and the second electrode.

14. The method of claim 8, wherein, in the first, second and third doping processes, the impurities include Group 3 elements or Group 5 elements.

15. The method of claim 7, wherein, in the first and second doping processes, the impurities include Group 3 elements.

* * * * *